(12) United States Patent
Chou et al.

(10) Patent No.: US 10,276,563 B2
(45) Date of Patent: Apr. 30, 2019

(54) SEMICONDUCTOR DEVICES AND METHODS FOR FORMING THE SAME

(71) Applicant: Vanguard International Semiconductor Corporation, Hsinchu (TW)

(72) Inventors: Ying-Kai Chou, Puzih (TW); Li-Che Chen, Hsinchu (TW); Hsing-Chao Liu, Jhudong Township (TW)

(73) Assignee: VANGUARD INTERNATIONAL SEMICONDUCTOR CORPORATION, Hsinchu (TW)

( * ) Notice: Subject to any disclaimer, the term of this patent is extended or adjusted under 35 U.S.C. 154(b) by 67 days.

(21) Appl. No.: 15/262,735

(22) Filed: Sep. 12, 2016

(65) Prior Publication Data

US 2018/0076282 A1 Mar. 15, 2018

(51) Int. Cl.
*H01L 21/02* (2006.01)
*H01L 21/28* (2006.01)
*H01L 21/762* (2006.01)
*H01L 27/088* (2006.01)
*H01L 21/8234* (2006.01)

(52) U.S. Cl.
CPC ...... *H01L 27/088* (2013.01); *H01L 21/28123* (2013.01); *H01L 21/76224* (2013.01); *H01L 21/823462* (2013.01); *H01L 21/823481* (2013.01); *H01L 21/02238* (2013.01); *H01L 21/02255* (2013.01)

(58) Field of Classification Search
CPC ............ H01L 29/0649; H01L 27/088; H01L 21/823481; H01L 21/823462; H01L 21/32; H01L 21/31053; H01L 21/02274; H01L 21/0217; H01L 21/31111; H01L 21/76224–21/76237; H01L 23/49838–23/4984
See application file for complete search history.

(56) References Cited

U.S. PATENT DOCUMENTS

2015/0015373 A1* 1/2015 Mongrenier ....... G06K 7/10366
340/10.1
2015/0041923 A1* 2/2015 Lu ....................... H01L 21/2652
257/401

FOREIGN PATENT DOCUMENTS

TW 201539649 A 10/2015
TW 201601334 A 1/2016

* cited by examiner

*Primary Examiner* — Moazzam Hossain
*Assistant Examiner* — Stanetta D Isaac
(74) *Attorney, Agent, or Firm* — Birch, Stewart, Kolasch & Birch, LLP

(57) ABSTRACT

A semiconductor device and a method for forming the same are provided. The method includes forming a patterned mask on a substrate, wherein the patterned mask includes a pad oxide layer and a silicon nitride layer over the pad oxide layer. The method also includes forming a trench in the substrate by performing a first etching process on the substrate through an opening of the patterned mask and forming a dielectric material layer in the trench, in the opening, and on the patterned mask. The method further includes performing a planarization process to remove the dielectric material layer outside of the trench, and performing a heat treatment process to form an oxidized portion at the interface of the pad oxide layer and the substrate and adjacent to the dielectric material layer.

14 Claims, 8 Drawing Sheets

SEMICONDUCTOR DEVICES AND METHODS FOR FORMING THE SAME

BACKGROUND OF THE INVENTION

Field of the Invention

The invention relates to semiconductor devices, and in particular to isolation structures of semiconductor devices and methods for forming the same.

Description of the Related Art

In general, a portion of the semiconductor device is formed in a substrate, and active regions of the semiconductor device are isolated by isolation structures formed in the substrate. As the size of semiconductor devices continues to shrink and device density continues to increase, the problems of surface roughness and the "bird's beak effect," which is caused by the conventional local oxidation of silicon (LOCOS) isolation technology, have become increasingly non-negligible. Therefore, shallow trench isolation (STI) technology has become a commonly used isolation technique for semiconductor devices with features below 0.25 micrometers.

Although existing isolation structures of semiconductor devices and methods for forming the same have been adequate for their intended purposes, they have not been entirely satisfactory in all respects. Therefore, up to the present, there are still some problems that can be solved in the isolation technologies of semiconductor devices.

BRIEF SUMMARY OF THE INVENTION

Embodiments of shallow trench isolation structures of semiconductor devices and methods for forming the same are provided. To overcome the problems of divots, which are easily formed at edges of an isolation structure and caused by over etching during an etching process for removing additional materials to form the isolation structure, a heat treatment process is performed before removing a patterned mask, which is used to form a trench in a substrate, so that an additional oxidized portion is formed at the edges of the isolation structure and a surface portion of a gate oxide layer formed at a junction of the isolation structure and an active region can be smooth. As a result, gate oxide integrity (GOI) of the gate oxide layer can be increased, and the probability of occurrence of point discharge and electrical breakdown can be decreased. The efficiency and reliability of the semiconductor devices are thereby increased.

Some embodiments of the disclosure provide a method for forming a semiconductor device. The method includes forming a patterned mask on a substrate, wherein the patterned mask includes a pad oxide layer and a silicon nitride layer over the pad oxide layer. The method also includes forming a trench in the substrate by performing a first etching process on the substrate through an opening of the patterned mask and forming a dielectric material layer in the trench, in the opening, and on the patterned mask. The method further includes performing a planarization process to remove the dielectric material layer outside of the trench and performing a heat treatment process to form an oxidized portion at an interface of the pad oxide layer and the substrate and adjacent to the dielectric material layer.

Some embodiments of the disclosure provide a semiconductor device. The semiconductor device includes an isolation structure disposed in a substrate. The semiconductor device also includes a gate oxide layer disposed on the substrate and a portion of the isolation structure, wherein the gate oxide layer has an extension portion at an edge of the isolation structure. The semiconductor device further includes a gate electrode layer disposed on the gate oxide layer and the isolation structure.

A detailed description is given in the following embodiments with reference to the accompanying drawings.

BRIEF DESCRIPTION OF THE DRAWINGS

The disclosure can be more fully understood from the following detailed description when read with the accompanying figures. It is worth noting that, in accordance with the standard practice in the industry, various features are not drawn to scale. In fact, the dimensions of the various features may be arbitrarily increased or reduced for clarity of discussion.

FIG. 1C is an exemplary cross sectional view of a comparative semiconductor device along line 1-1 of FIG. 1A.

FIG. 1C' is a partial enlarged view of region A of FIG. 1C.

FIG. 2I is an exemplary cross sectional view of a semiconductor device along line 1-1 of FIG. 1A in accordance with some embodiments of the present disclosure.

FIG. 2H' is a partial enlarged view of region B of FIG. 2H in accordance with some embodiments of the present disclosure.

FIG. 2I' is a partial enlarged view of region C of FIG. 2I in accordance with some embodiments of the present disclosure.

DETAILED DESCRIPTION OF THE INVENTION

Figure 1A:
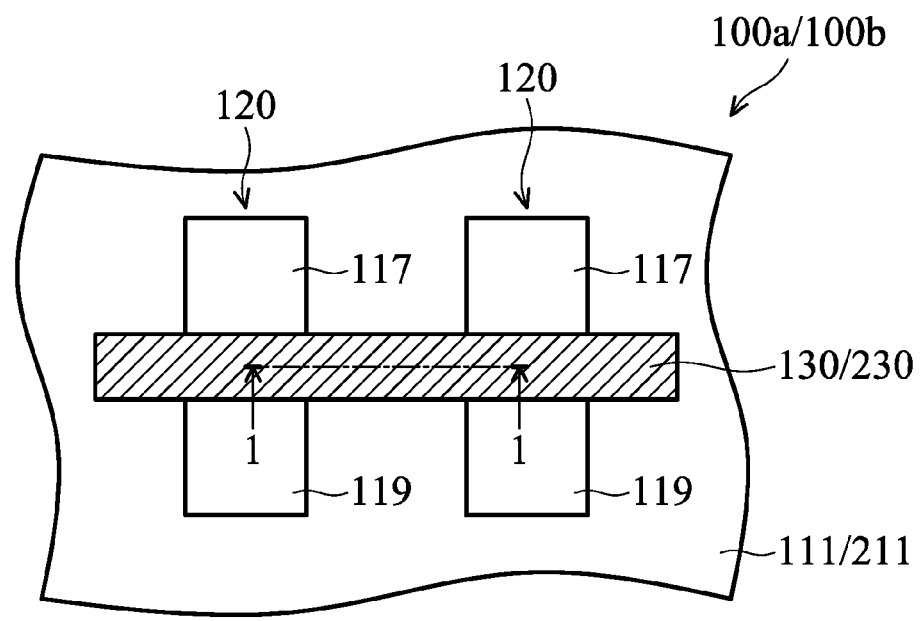
FIG. 1A is a top view of a semiconductor device or a comparative semiconductor device.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first component over or on a second component in the description that follows may include embodiments in which the first and second components are formed in direct contact, and may also include embodiments in which additional components may be formed between the first and second components, such that the first and second components may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described below. Throughout the various views and illustrative embodiments, like reference numbers are used to designate like elements. It should be understood that additional operations can be provided before, during, and after the method, and some of the operations described can be replaced or eliminated for other embodiments of the method. In the prior art, since the size and depth of the recess at the edges of the isolation structure is too large, the portion of the gate oxide layer formed on the recess is thinner than the portion of the gate oxide layer formed on the semiconductor substrate, such that the gate electrode layer is too close to the semiconductor substrate at the edges of the isolation structure. Moreover, since the surfaces of the gate oxide layer and the gate electrode layer in the recess are too curved and not smooth, some problems, for example, point discharge, electrical breakdown effects and short circuits, may be caused easily. The embodiments of the present disclosure can overcome the above-mentioned problems, so that the efficiency and reliability of the semiconductor devices can be increased.

Figure 1B:
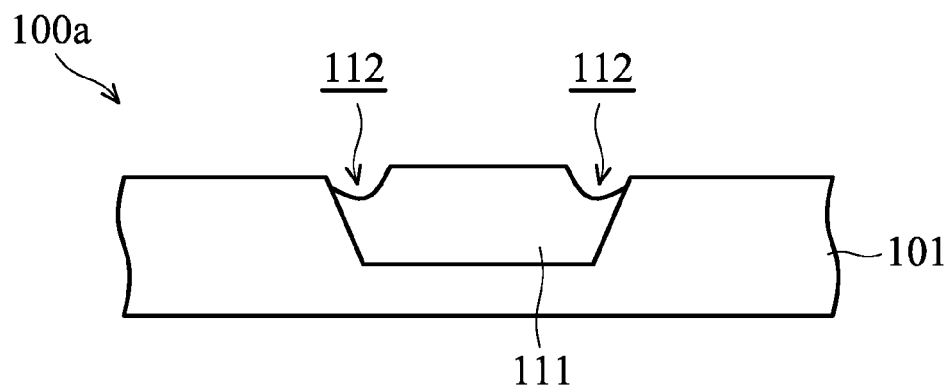
FIGS. 1B to 1C are cross-sectional views illustrating an exemplary sequential forming process of a comparative semiconductor device.
Figure 1C:
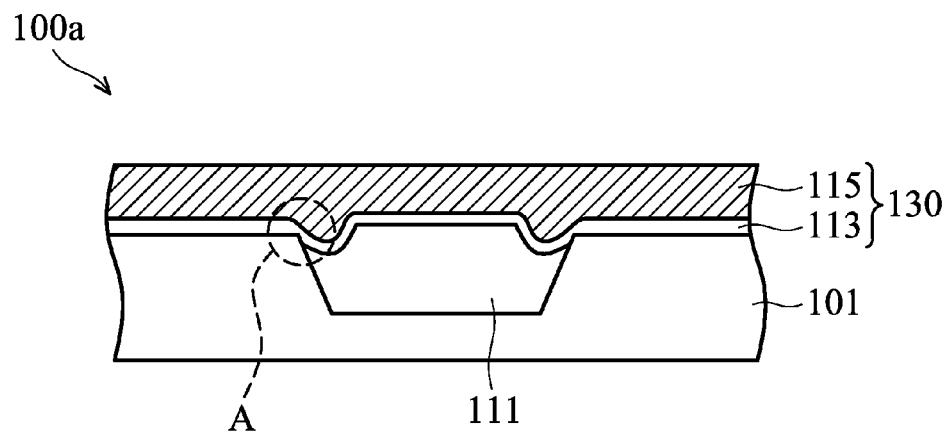
Figure 1C:
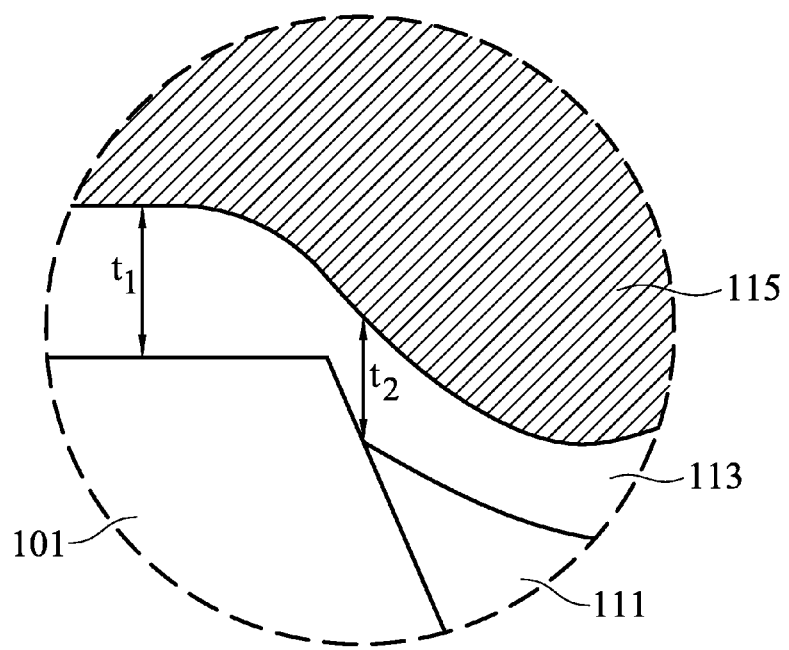

FIG. 1A is a top view of a comparative semiconductor device 100a or a semiconductor device 100b according to some embodiments. FIGS. 1B to 1C are cross-sectional views illustrating an exemplary sequential forming process of the comparative semiconductor device 100a. FIG. 1C' is a partial enlarged view of region A of FIG. 1C.

As shown in FIG. 1A, active regions 120 of the comparative semiconductor device 100a include source regions 117 and drain regions 119, and an isolation structure 111 is located between two adjacent active regions 120 to isolate and surround two active regions 120. A gate structure 130 of the comparative semiconductor device 100a includes a gate oxide layer 113 and a gate electrode layer 115 over the gate oxide layer 113 (as shown in FIG. 1C). The gate structure 130 is located between the source region 117 and the drain region 119 of the active region 120 and straddle the active regions 120 and the isolation structure 111. FIG. 1C is an exemplary cross sectional view of the comparative semiconductor device 100a along line 1-1 of FIG. 1A.

As shown in FIG. 1B, the isolation structure 111 is formed in a substrate 101, wherein the substrate 101 is a semiconductor substrate. The isolation structure 111 of the comparative semiconductor device 100a has recesses 112 shown obviously at its edges. The formation of recesses 112 is that when a patterned mask (not shown) on the substrate 101, which is used to form a trench of the isolation structure 111, is removed, an isotropic etching process is used. Since the materials of the isolation structure 111 and a pad oxide layer of the patterned mask are similar, and the pad oxide layer is thinner than the isolation structure 111, the over-etching phenomenon can easily happen at the edges of the isolation structure 111, where the difference of the thicknesses is the most obvious.

As shown in FIGS. 1C and 1C', the gate oxide layer 113 and the gate electrode layer 115 are formed sequentially on the isolation structure 111 and the substrate 101. Since the isolation structure 111 has recesses 112 at its edges, the thickness $t_2$ of the gate oxide layer 113 on the recesses 112 of the isolation structure 111 is less than the thickness $t_1$ of the gate oxide layer 113 on the substrate 101. In some cases, the ratio of $t_2$ to $t_1$ is between 0.7 and 0.85. Since a portion of the gate oxide layer 113 formed on the recesses 112 is thinner than another portion of the gate oxide layer 113 formed on the substrate 101, the gate electrode layer 115 is too close to the substrate 101 at the edges of the isolation structure 111. Moreover, since the surfaces of the gate oxide layer 113 and the gate electrode layer 115 in the recesses 112 are too curved and not smooth, some problems, for example, point discharge, the electrical breakdown effect, and short circuits, may be caused easily. Furthermore, as the size of semiconductor devices continues to shrink, the efficiency and reliability of the semiconductor devices are decreased incredibly because of the above-mentioned problems.

Figure 2A:
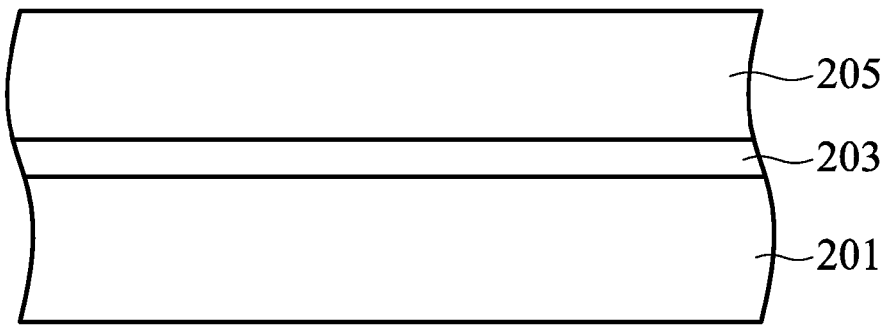
FIGS. 2A to 2I are cross-sectional views illustrating an exemplary sequential forming process of a semiconductor device in accordance with some embodiments of the present disclosure.
Figure 2B:
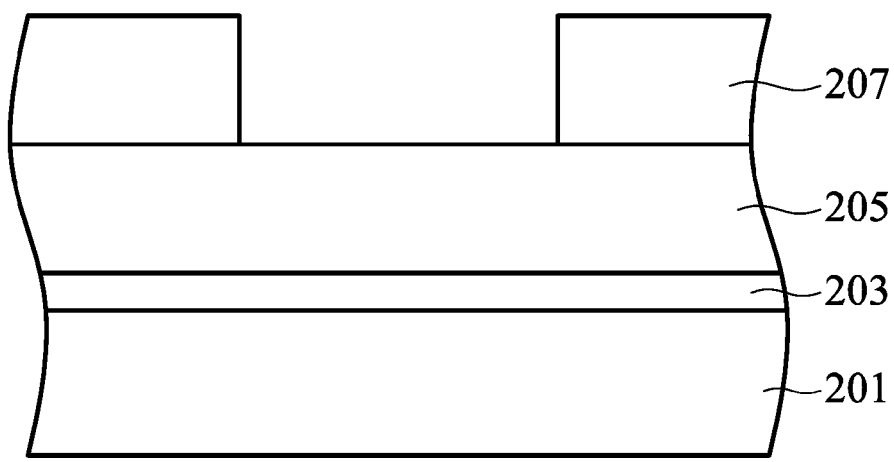
Figure 2C:
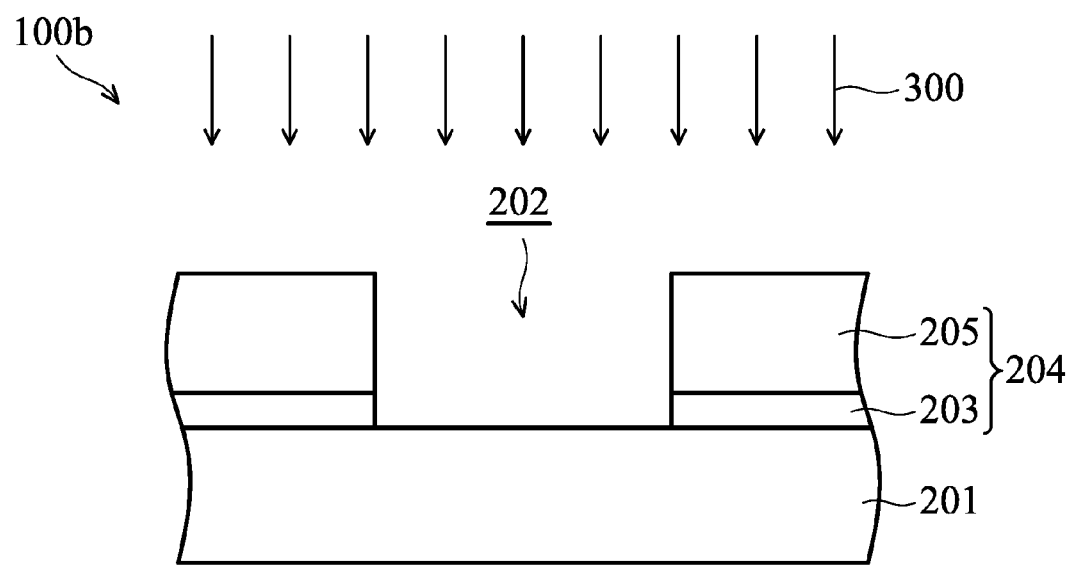
Figure 2D:
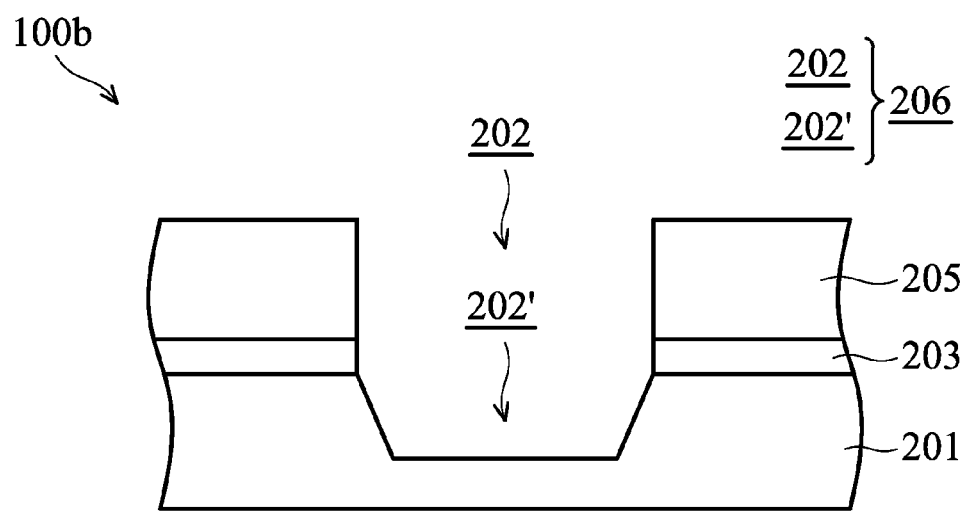
Figure 2E:
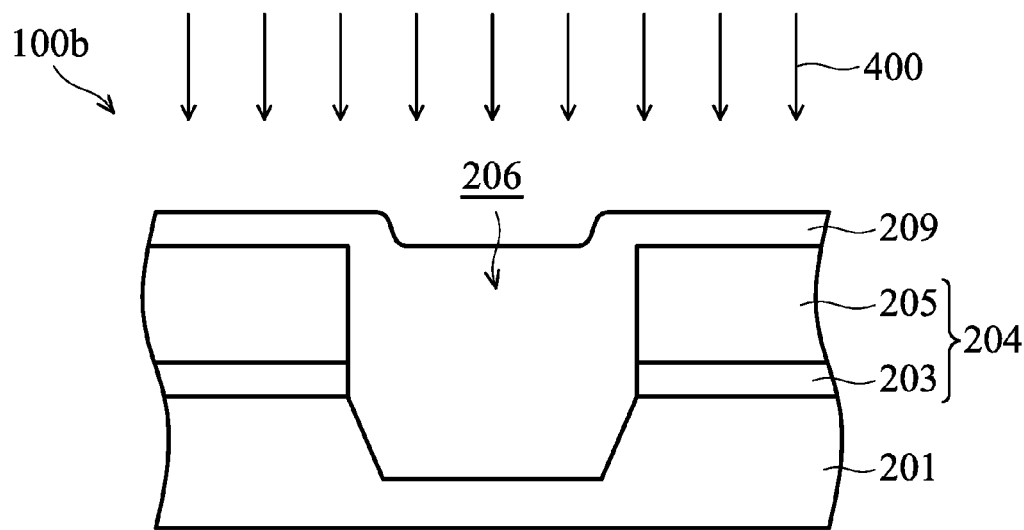
Figure 2F:
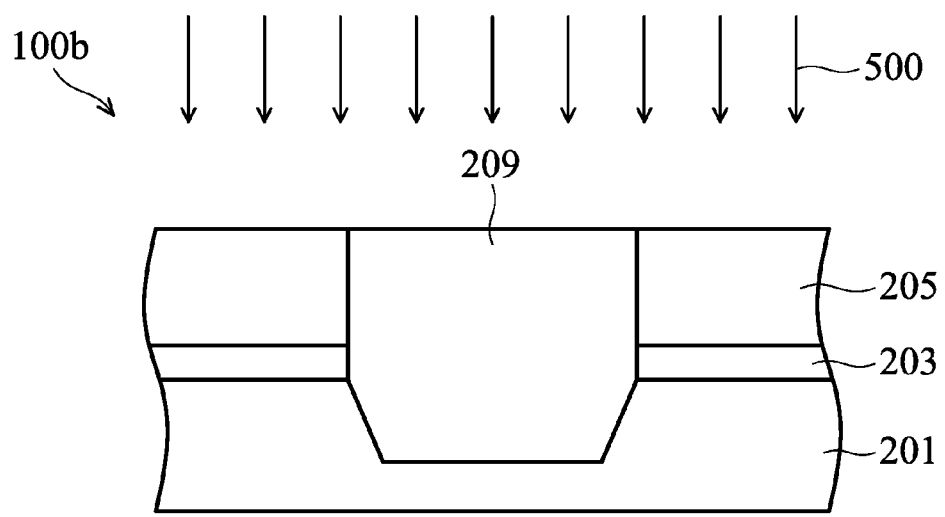
Figure 2G:
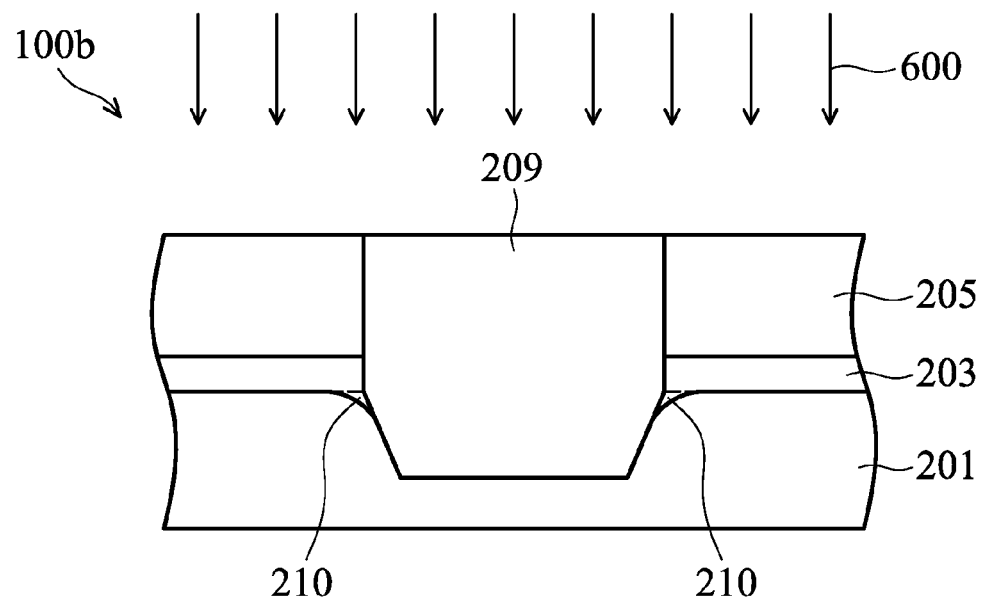
Figure 2H:
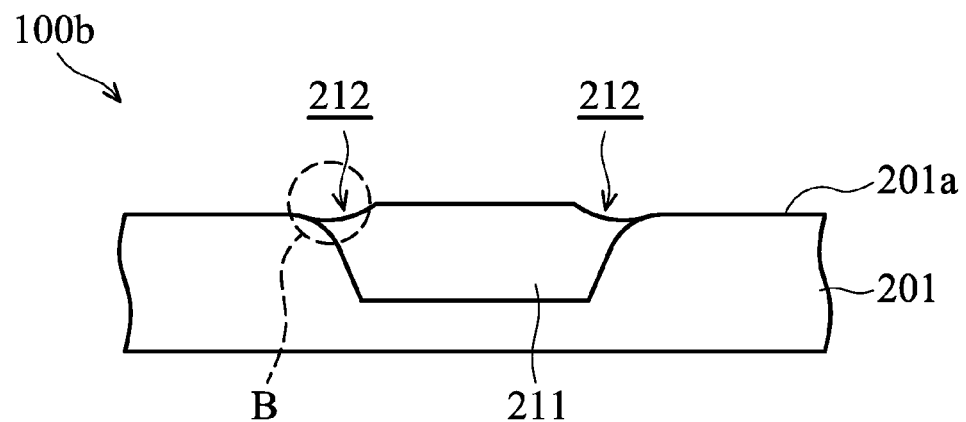
Figure 2H:
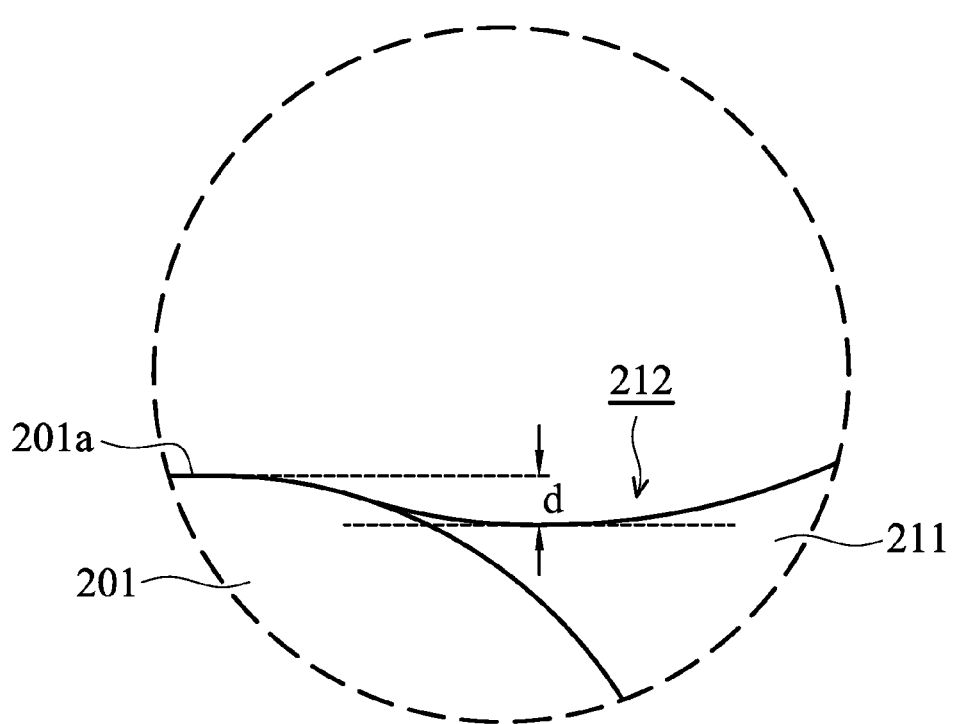
Figure 2I:
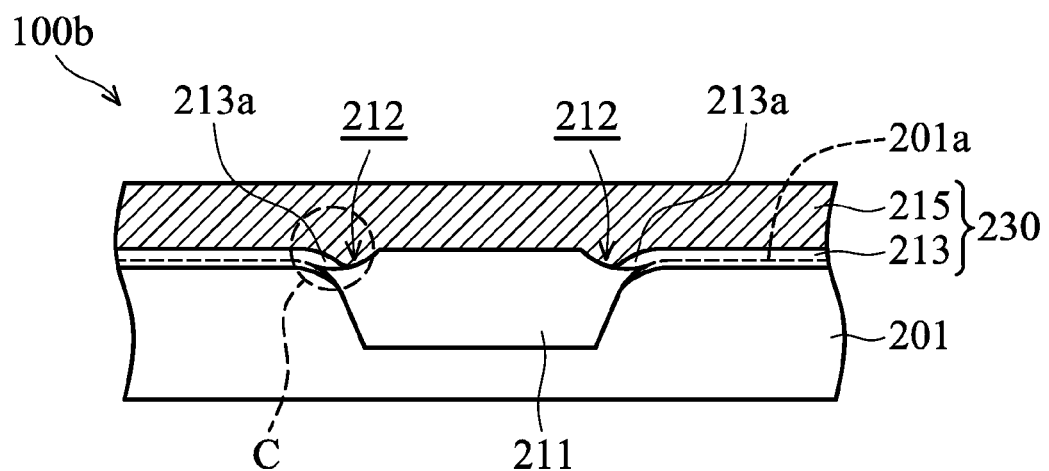
Figure 2I:
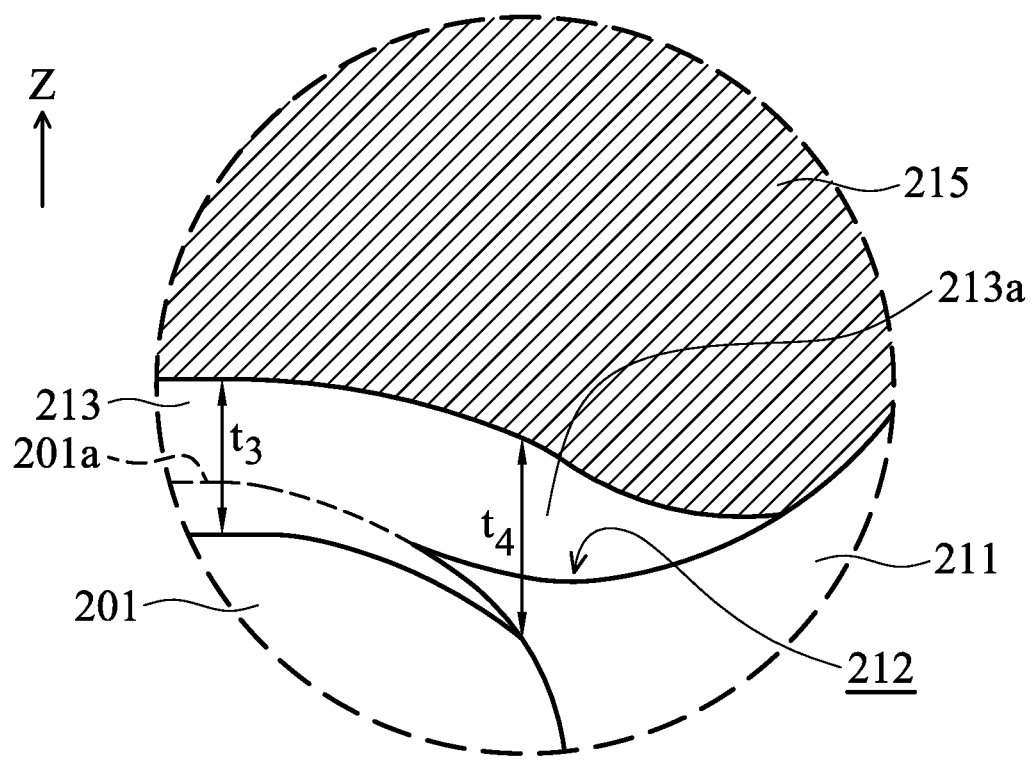

FIGS. 2A to 2I are cross-sectional views illustrating an exemplary sequential forming process of a semiconductor device 100b in accordance with some embodiments of the present disclosure. FIG. 2I is an exemplary cross sectional view of the semiconductor device 100b along line 1-1 of FIG. 1A in accordance with some embodiments of the present disclosure. The semiconductor device 100b includes a substrate 201. In some embodiments, the substrate 201 may be made of silicon or other semiconductor materials. Alternatively, the substrate 201 may include other elementary semiconductor materials such as germanium. In some embodiments, the substrate 201 is made of a compound semiconductor such as silicon carbide, gallium nitride, gallium arsenic, indium arsenide, or indium phosphide. In some embodiments, the substrate 201 is made of an alloy semiconductor such as silicon germanium, silicon germanium carbide, gallium arsenic phosphide, or gallium indium phosphide. In some embodiments, the substrate 201 includes a semiconductor-on-insulator (SOI) substrate. In some embodiments, the substrate 201 includes an epitaxial layer. For example, the substrate 201 has an epitaxial layer overlying a bulk semiconductor.

As shown in FIG. 2A, a pad oxide layer 203 and a silicon nitride layer 205 are formed sequentially on the substrate 201, in accordance with some embodiments. In some embodiments, the silicon nitride layer 205 may be replaced by silicon oxynitride or other similar materials. In some embodiments, the pad oxide layer 203 is formed by using a thermal oxidation process or other applicable processes. In some embodiments, the silicon nitride layer 205 is formed by using a chemical vapor deposition (CVD) process or other applicable processes. The pad oxide layer 203 is used as a buffer layer for releasing the stress between the silicon nitride layer 205 and the substrate 201, and the silicon nitride layer 205 is used as a stop layer for a planarization process which will be performed later on.

As shown in FIG. 2B, a patterned photoresist layer 207 is formed on the silicon nitride layer 205, in accordance with some embodiments. An isolation structure will be formed subsequently on the region which is not covered by the patterned photoresist layer 207 (Such as the region of the isolation structure 211 shown in FIG. 1A), and the region which is covered by the patterned photoresist layer 207 will become an active region in the following steps (Such as the active region 120 shown in FIG. 1A). Then, the pad oxide layer 203 and the silicon nitride layer 205 are patterned by utilizing the patterned photoresist layer 207 as a mask, so that a patterned mask 204 is formed as shown in FIG. 2C. The patterned mask 204 includes the pad oxide layer 203 and the silicon nitride layer 205, and the patterned mask 204 will be used in the following etching process to form a trench in the substrate 201.

As shown in FIGS. 2C and 2D, a trench 202' is formed in the substrate 201 by performing a first etching process 300 on the substrate 201 through an opening 202 of the patterned mask 204, and the trench 202' inside the substrate 201 and the opening 202 of the patterned mask 204 compose a trench 206 as shown in FIG. 2D, in accordance with some embodiments. In some embodiments, the first etching process 300 includes a wet etching process, a dry etching process or other applicable processes. In some embodiments, the dry etching process includes a plasma etching process using a fluorine-containing gas, a chlorine-containing gas, or other applicable gases. In some embodiments, the depth of the trench 206 is smaller than 0.5 microns, but it is not limited thereto. The depth of the trench 206 may be adjusted according to the size of the semiconductor device.

Next, as shown in FIG. 2E, a dielectric material layer 209 is formed in the trench 206 (i.e. in the trench 202' and the opening 202) and on the patterned mask 204. In some embodiments, the dielectric material layer 209 is made of silicon oxide, silicon nitride, silicon oxynitride or another applicable dielectric material. In some embodiments, the material used to form the dielectric material layer 209 is different from the material used to form the pad oxide layer 203. In some embodiments, the dielectric material layer 209 is formed by using a chemical vapor deposition process, an atmospheric pressure chemical vapor deposition (APCVD) process, a high density plasma chemical vapor deposition (HDPCVD) process or other applicable process.

As shown in FIGS. 2E and 2F, a planarization process 400 is performed by using the silicon nitride layer 205 as a stop layer in order to remove a portion of the dielectric material layer 209 outside of the trench 206, that is, the portion of the dielectric material layer 209 on the silicon nitride layer 205, so that the top surface of the dielectric material layer 209 in the trench 206 is level with the top surface of the silicon nitride layer 205, as shown in FIG. 2F, in accordance with some embodiments. In some embodiments, the planarization process 400 may further remove a portion of the silicon nitride layer 205. In some embodiments, the planarization process 400 may include a chemical mechanical polishing (CMP) process, a grinding process, an etching process, another applicable process, or a combination thereof.

After performing the planarization process 400, as shown in FIG. 2F, a heat treatment process 500 is performed by introducing oxygen gas into the semiconductor device 100b, in accordance with some embodiments. The oxygen gas is diffused into the vertical interface among the dielectric material layer 209, the substrate 201 and the pad oxide layer 203 to form oxidized portions 210 at the interface between the pad oxide layer 203 and the substrate 201 in the horizontal direction, as shown in FIG. 2G. The oxidized portions 210 are adjacent to the dielectric material layer 209 at the sidewalls of the trench 206 (as shown in FIG. 2G). The oxidized portions 210 are formed on both sides of the edges of the dielectric material layer 209 in the trench 206, and the oxidized portions 210 are similar to the bird's beak structure caused by the local oxidation of silicon (LOCOS) isolation technology. In some embodiments, the heat treatment process 500 is operated at a temperature in a range from about 950° C. to about 1050° C. In some embodiments, the duration of the heat treatment process 500 is in a range from about 15 minutes to about 40 minutes. It is worth noting that the shape and thickness of the oxidized portions 210 may be controlled by the temperature and time of the heat treatment process 500.

Afterwards, as shown in FIG. 2G, a second etching process 600 is performed in order to remove the silicon nitride layer 205, the pad oxide layer 203, a portion of the dielectric material layer 209 and a portion of the oxidized portions 210, so that a top surface 201a of the substrate 201 is exposed, and an isolation structure 211 with sharp portions, which is similar to a bird's beak, at it's both sides is formed as shown in FIG. 2H, in accordance with some embodiments. In some embodiments, the second etching process 600 includes a wet etching process, a dry etching process or another applicable process. In some embodiments, the wet etching process may use a solution of phosphoric acid to perform a one-step process. In other embodiments, the wet etching process may use solutions of phosphoric acid and hydrofluoric acid to perform a two-step process. In some embodiments, the isolation structure 211 is a shallow trench isolation (STI) structure whose depth is smaller than 0.5 microns.

Next, FIG. 2H' is a partial enlarged view of region B of FIG. 2H in accordance with some embodiments of the present disclosure. As shown in FIG. 2H', the isolation structure 211 has recesses 212 at the top of both of its sides close to the substrate 201. In some embodiments, the vertical distance d between the bottom surface of the recesses 212 and the top surface 201a of the substrate 201 is less than about 50 Å. It is worth noting that, the depth of the recesses 212 at the edges of the isolation structure 211 of the semiconductor device 100b in FIG. 2H, which is based on the embodiments of the present disclosure, is smaller than the depth of the recesses 112 at the edges of the isolation structure 111 of the comparative semiconductor device 100a in FIG. 1B. The additional heat treatment process 500 performed on the semiconductor device 100b instead of the semiconductor device 100a is the cause of the shallow recesses 212, so that a smoother surface is formed on the semiconductor device 100b after the following second etching process 600 is performed. In some embodiments, the depth of the recesses 212 (such as the vertical distance d) may be adjusted by the shape and size of the oxidized portions 210 through the temperature and time duration of the heat treatment process 500. In other embodiments, the value of the vertical distance d is small enough to be negligible, so that the whole top surface of the isolation structure 211 is substantially flat. In other embodiments, the top surface of the isolation structure 211 is substantially level with the top surface of the substrate 201.

As shown in FIG. 2I, a gate oxide layer 213 of the gate stack 230 as shown in FIG. 1A is formed in the recesses 212 and on the top surface 201a of the substrate 201 (More specifically, the gate oxide layer 213 is formed near the upper and lower regions of the top surface 201a), and a gate electrode layer 215 of the gate stack 230 as shown in FIG. 1A is formed on the isolation structure 211 and the gate oxide layer 213, in accordance with some embodiments. In some embodiments, the gate oxide layer 213 and the gate electrode layer 215 are formed respectively by a thermal oxidation process, chemical vapor deposition process, flowable chemical vapor deposition (FCVD) process, atomic layer deposition (ALD) process, low-pressure chemical vapor deposition (LPCVD) process, plasma enhanced chemical vapor deposition (PECVD) process, another applicable process, or a combination thereof. In some embodiments, the gate oxide layer 213 may be made of silicon oxide or other dielectric materials with a high dielectric constant (high-k). The high-k dielectric materials may be made of hafnium oxide, zirconium oxide, aluminum oxide, hafnium dioxide-alumina alloy, hafnium silicon oxide, hafnium silicon oxynitride, hafnium tantalum oxide, hafnium titanium oxide, hafnium zirconium oxide, other suitable high-k materials, or a combination thereof. In some embodiments, the gate electrode layer 215 includes metals or other suitable conductive materials, such as tungsten, copper, nickel, aluminum, tungsten silicide, polysilicon or a combination thereof.

As shown in FIG. 2I, the gate oxide layer 213 has extension portions 213a in the recesses 212 at both sides of the isolation structure 211 adjacent to the substrate 201. In some embodiments, the distance between the top surface of the extension portions 213a and the junction of the isolation structure 211 and the substrate 201 in a direction that is perpendicular to the surface of the substrate 201 is in a range from 130 Å to 500 Å. FIG. 2I' is a partial enlarged view of region C of FIG. 2I in accordance with some embodiments of the present disclosure. In some embodiments, the distance $t_4$ between the top surface of the extension portions 213a and the junction of the isolation structure 211 and the substrate 201 in a direction (for example, Z-axis direction) that is perpendicular to the surface of the substrate 201 is only slightly less or greater than the thickness $t_3$ of the gate oxide layer 213 on the substrate 201. In some embodiments, the ratio of $t_4$ to $t_3$ is greater than about 0.95. The top surface of the gate oxide layer 213 above the substrate 201 and the isolation structure 211 is smooth and substantially flat due to the formation of the extension portions 213a.

Compared to the comparative semiconductor device 100a with the semiconductor device 100b in some embodiments of the present disclosure, the ratio of the thickness $t_2$ of the gate oxide layer 113 at the edges of the isolation structure 111 to the thickness $t_1$ of the gate oxide layer 113 on the substrate 101 of the comparative semiconductor device 100a as shown in FIG. 1C' is less than 0.85. Regarding the semiconductor device 100b shown in FIG. 2I' in some embodiments of the present disclosure, the gate oxide layer 213 has extension portions 213a at the edges of the isolation structure 211. The ratio of the distance $t_4$ between the top surface of the extension portion 213a and the junction of the isolation structure 211 and the substrate 201 in the direction that is perpendicular to the surface of the substrate 201 to the thickness $t_3$ of the gate oxide layer 213 on the substrate 201 is greater than 0.95, and the top surface of the gate oxide layer 213 in the embodiments is smoother than the surface of the gate oxide layer 113 in the comparative examples. There is no obvious recess feature in the isolation structure 211 of the embodiments, and so that the problems of point discharge, electrical breakdown and short circuits can be avoided. Therefore, the efficiency and reliability of the semiconductor devices according to the embodiments of the present disclosure can be increased.

The method for forming the semiconductor device in some embodiments of the present disclosure comprises forming the oxidized portions at the interface among the dielectric material layer, the substrate and the pad oxide layer by performing the heat treatment process, and the oxidized portions are adjacent to the dielectric material layer on the sidewalls of the trench, before removing the patterned mask. Thus, the thickness of the oxide layer at the edges of the isolation structure formed later on is increased. Then, the formation of the recesses at the edges of the isolation structure caused by the etching process for removing the patterned mask later on is avoided, or the size and depth of the recesses is decreased. Therefore, a gate oxide layer with a flat surface is formed through the following steps in order to improve gate oxide integrity.

In known technology, since the size and depth of the recess at the edges of the isolation structure is too large, the portion of the gate oxide layer formed on the recess is thinner than the portion of the gate oxide layer formed on the semiconductor substrate, such that the gate electrode layer is too close to the semiconductor substrate at the edges of the isolation structure. Moreover, in known technology, since the surfaces of the gate oxide layer and the gate electrode layer in the recess are too curved and are not smooth, some problems may easily arise, including point discharge, electrical breakdown, and short circuits. The embodiments of the present disclosure can solve the above-mentioned problems, so that the efficiency and reliability of the semiconductor devices can be increased.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor device, the semiconductor device comprising:
   an isolation structure disposed in a substrate, the isolation structure having a bottom surface contacting the substrate and a top surface opposite to the bottom surface;
   a gate oxide layer disposed on the substrate and a portion of the isolation structure, wherein the gate oxide layer has an extension portion at an edge of the isolation structure, and the extension portion is split into two branches at a distal end thereof, wherein one of the branches extends below the top surface of the isolation structure and is disposed between the isolation structure and the substrate, and the other of the branches extends above the top surface of the isolation structure at the edge of the isolation structure such that the edge of the isolation structure is directly sandwiched between the two branches of the extension portion; and
   a gate electrode layer disposed on the gate oxide layer and the isolation structure,
   wherein a ratio of a distance between a top surface of the extension portion and a junction of the isolation structure and the substrate in a direction that is perpendicular to a surface of the substrate to a thickness of the gate oxide layer on the substrate is greater than 0.95,
   the method comprising:
   forming a patterned mask on the substrate, wherein the patterned mask comprises a pad oxide layer and a silicon nitride layer over the pad oxide layer;
   forming a trench in the substrate by performing a first etching process on the substrate through an opening of the patterned mask;
   forming a dielectric material layer in the trench, in the opening, and on the patterned mask;
   performing a planarization process to remove the dielectric material layer outside of the trench; and
   performing a heat treatment process to form an oxidized portion at an interface of the pad oxide layer and the substrate and adjacent to the dielectric material layer.

2. The method as claimed in claim 1, wherein forming the dielectric material layer comprises performing a high-density plasma chemical vapor deposition process.

3. The method as claimed in claim 1, wherein the planarization process comprises a chemical mechanical polishing process.

4. The method as claimed in claim 1, wherein the heat treatment process is operated at a temperature in a range from 950° C. to 1050° C.

5. The method as claimed in claim 1, wherein a duration of the heat treatment process is in a range from 15 minutes to 40 minutes.

6. The method as claimed in claim 1, further comprising:
   after performing the heat treatment process, performing a second etching process to remove the silicon nitride layer, the pad oxide layer and a portion of the dielectric material layer to form the isolation structure in the trench.

7. The method as claimed in claim 6, wherein the second etching process comprises a wet etching process.

8. The method as claimed in claim 6, wherein the second etching process comprises a dry etching process.

9. The method as claimed in claim 6, wherein the isolation structure is a shallow trench isolation structure.

10. The method as claimed in claim 6, further comprising:
forming the gate oxide layer on the substrate and a portion of the isolation structure; and
forming the gate electrode layer on the gate oxide layer and the isolation structure.

11. A semiconductor device, comprising:
an isolation structure disposed in a substrate, the isolation structure having a bottom surface contacting the substrate and a top surface opposite to the bottom surface;
a gate oxide layer disposed on the substrate and a portion of the isolation structure, wherein the gate oxide layer has an extension portion at an edge of the isolation structure, and the extension portion is split into two branches at a distal end thereof, wherein one of the branches extends below the top surface of the isolation structure and is disposed between the isolation structure and the substrate, and the other of the branches extends above the top surface of the isolation structure at the edge of the isolation structure such that the edge of the isolation structure is directly sandwiched between the two branches of the extension portion; and
a gate electrode layer disposed on the gate oxide layer and the isolation structure,
wherein a ratio of a distance between a top surface of the extension portion and a junction of the isolation structure and the substrate in a direction that is perpendicular to a surface of the substrate to a thickness of the gate oxide layer on the substrate is greater than 0.95.

12. The semiconductor device as claimed in claim 11, wherein the isolation structure is a shallow trench isolation structure.

13. The semiconductor device as claimed in claim 11, wherein the distance between the top surface of the extension portion and the junction of the isolation structure and the substrate in the direction that is perpendicular to the surface of the substrate is larger than the thickness of the gate oxide layer on the substrate.

14. The semiconductor device as claimed in claim 11, wherein the distance between the top surface of the extension portion and the junction of the isolation structure and the substrate in the direction that is perpendicular to the surface of the substrate is in a range from 130 Å to 500 Å.

* * * * *